(12) United States Patent
Wang et al.

(10) Patent No.: US 11,139,328 B2
(45) Date of Patent: Oct. 5, 2021

(54) MANUFACTURE OF SEMICONDUCTOR MODULE WITH TRANSPARENT MOLDING COMPONENT

(71) Applicant: Sunny Opotech North America, Inc., Yuyao (CN)

(72) Inventors: Mingzhu Wang, Zhejiang (CN); Takehiko Tanaka, Zhejiang (CN); Nan Guo, Yuyao (CN); Zhenyu Chen, Zhejiang (CN); Bojie Zhao, Zhejiang (CN)

(73) Assignee: Sunny Opotech North America Inc., Yuyao (CN)

( * ) Notice: Subject to any disclaimer, the term of this patent is extended or adjusted under 35 U.S.C. 154(b) by 0 days.

(21) Appl. No.: 15/959,603

(22) Filed: Apr. 23, 2018

(65) Prior Publication Data

US 2019/0319057 A1    Oct. 17, 2019

(30) Foreign Application Priority Data

Apr. 12, 2018 (CN) .......................... 201820520309.7

(51) Int. Cl.

| H01L 27/146 | (2006.01) |
| H01L 21/56 | (2006.01) |
| H04N 5/225 | (2006.01) |
| B29C 45/14 | (2006.01) |
| H04N 5/369 | (2011.01) |
| B29L 31/34 | (2006.01) |

(52) U.S. Cl.
CPC .. *H01L 27/14618* (2013.01); *B29C 45/14467* (2013.01); *B29C 45/14639* (2013.01); *H01L 21/565* (2013.01); *H01L 27/14685* (2013.01); *H04N 5/2254* (2013.01); *H04N 5/369* (2013.01); *B29L 2031/3481* (2013.01); *H04N 5/2253* (2013.01)

(58) Field of Classification Search
CPC .......................... H01L 27/14643–14663; H01L 27/146–14893; H04N 5/335–378
USPC ........ 348/294–324; 250/208.1; 257/225–234, 257/257, 258, 291–294, 431–448
See application file for complete search history.

(56) References Cited

U.S. PATENT DOCUMENTS

| 5,175,783 A | 12/1992 | Tatoh |
| 5,937,279 A | 8/1999 | Sawada et al. |
| 6,036,908 A | 3/2000 | Nishida et al. |

(Continued)

*Primary Examiner* — Xi Wang
(74) *Attorney, Agent, or Firm* — Sheppard Mullin Richter & Hampton LLP

(57) ABSTRACT

A semiconductor module for an image-sensing device is disclosed. The semiconductor module may include: a printed circuit board (PCB), a photosensitive member, at least an electric component and a molding component. The PCB may have a first surface, and the photosensitive member and the electric component are positioned on the first surface of the PCB. The molding component may be formed along with the first surface of the PCB, and separate the photosensitive member and the electric component from the ambient environment. The molding component may be in direct contact with the photosensitive member, the electric component and the first surface of the PCB. At least a portion of the molding component may be transparent to allow at last 50% of the incident light to pass through the molding component to reach the photosensitive member.

12 Claims, 9 Drawing Sheets

(56) References Cited

U.S. PATENT DOCUMENTS

| | | |
|---|---|---|
| 6,414,384 B1 | 7/2002 | Lo et al. |
| 6,835,596 B2 | 12/2004 | Gotou et al. |
| 7,176,055 B2 | 2/2007 | Tsukahara et al. |
| 7,296,345 B1 | 11/2007 | Wang et al. |
| 2004/0251509 A1* | 12/2004 | Choi ................ H01L 27/14618 257/432 |
| 2005/0059188 A1 | 3/2005 | Bolken et al. |
| 2005/0285016 A1* | 12/2005 | Kong ............... H01L 27/14618 250/208.1 |
| 2006/0065964 A1 | 3/2006 | Ohsumi |
| 2007/0010041 A1 | 1/2007 | Kang et al. |
| 2007/0029569 A1 | 2/2007 | Andrews |
| 2007/0183773 A1 | 8/2007 | Aoki et al. |
| 2007/0236591 A1 | 10/2007 | Tam et al. |
| 2008/0283952 A1 | 11/2008 | Choi et al. |
| 2009/0161006 A1* | 6/2009 | Lee ..................... H04N 5/2252 348/374 |
| 2010/0200898 A1* | 8/2010 | Lin ................... H01L 27/14621 257/294 |
| 2010/0253832 A1 | 10/2010 | Duparre |
| 2012/0018830 A1* | 1/2012 | Lin ................... H01L 27/14618 257/432 |
| 2012/0112042 A1* | 5/2012 | Webster ........... H01L 27/14618 250/208.1 |
| 2012/0300142 A1 | 11/2012 | Kim et al. |
| 2013/0128106 A1 | 5/2013 | Tam et al. |
| 2014/0300805 A1* | 10/2014 | Davis ..................... H04N 5/238 348/362 |
| 2015/0222793 A1* | 8/2015 | Kang ................... H04N 5/2257 348/373 |
| 2015/0334843 A1 | 11/2015 | Jung et al. |
| 2015/0350500 A1 | 12/2015 | Gutierrez et al. |
| 2018/0138221 A1 | 5/2018 | Wan et al. |
| 2018/0286913 A1 | 10/2018 | Wang et al. |
| 2019/0319057 A1 | 10/2019 | Wang et al. |
| 2019/0326342 A1 | 10/2019 | Wang et al. |

* cited by examiner

MANUFACTURE OF SEMICONDUCTOR MODULE WITH TRANSPARENT MOLDING COMPONENT

TECHNICAL FIELD

The disclosure relates generally to systems and methods for preparing semiconductor modules, particularly, semiconductor modules used in image-sensing devices such as cameras in portable devices.

BACKGROUND

Image-sensing devices are widely used in electronic devices. The image-sensing devices need to be configured to fit in the electronic devices, the design of which is often driven by consumer demands. For instance, with portable electronic devices, consumers prefer smaller sizes and are generally not willing to accept any sacrifice with respect to the devices' capabilities and qualities. In the field of portable electronic devices, such as smartphones and tablets, thinner devices are typically considered more attractive than thicker ones.

Image-sensing devices generally include a circuit board, a photosensitive member, electric components, an optical lens or lens assembly, and a holder that mounts the other components on the circuit board. In some designs, an optical filter or film is disposed between the lens and the photosensitive member.

Molding is often used in image-sensing devices to protect the electric components and support an optical lens or lens assembly. In a conventional molding method, especially in MOC (Molding on Chip), a photosensitive area of a photosensitive member needs to be strictly protected from contamination and physical damage such as scratches or even breakages by molds or external particles. In an actual product manufacturing process, such contamination and damage may be inevitable, and even lead to product scrapping and cost loss.

In addition, conventional molding materials are often opaque or comprised of black materials, such as nylon, LCP (liquid crystal polymer), PP (Polypropylene), etc., and resin is generally used in a molding process. The molded photosensitive member can be protected with use of these opaque molding material. However, using the opaque molding materials may limit the structures and manufacturing processes of an image-sensing device. In particular, an opening is required in a molding component to create a window above the photosensitive area of a photosensitive member. Moreover, the conventional molding process also requires a clean environment in assembly process after the manufacturing process to protect the image-sensing device from contamination.

In this disclosure, a novel image-sensing device with a transparent molding component is presented. As discussed herein, the configuration, composition, and/or properties of this unique molding component may avoid the drawbacks mentioned above.

SUMMARY

One aspect of this disclosure is directed to a semiconductor module for an image-sensing device. The semiconductor module may include: a printed circuit board (PCB), a photosensitive member, at least an electric component and a molding component. The PCB may have a first surface, and the photosensitive member and the electric component are positioned on the first surface of the PCB. The molding component may be formed along with the first surface of the PCB, and separate the photosensitive member and the electric component from the ambient environment. The molding component may be in direct contact with the photosensitive member, the electric component and the first surface of the PCB. At least a portion of the molding component may be transparent to allow at last 50% of the incident light to pass through the molding component to reach the photosensitive member.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this disclosure, illustrate several non-limiting embodiments and, together with the description, serve to explain the disclosed principles.

DETAILED DESCRIPTION OF THE EMBODIMENTS

Figure 1:
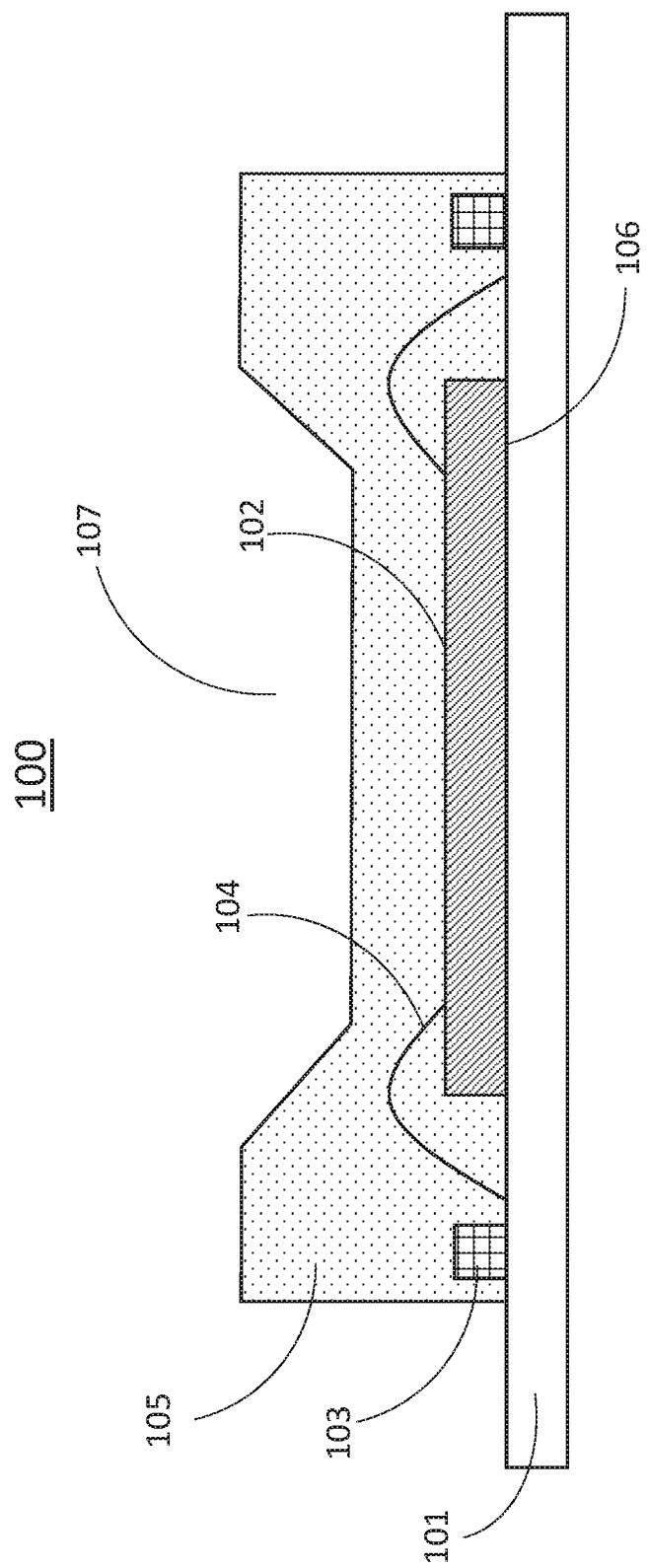
FIG. 1 is graphical representation illustrating an example of a semiconductor module, consistent with exemplary embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems and methods consistent with aspects related to the invention.

Introduction and Definitions

In some common designs of image-sensing devices, the photosensitive member (e.g., image-sensing wafer) and the electric components are located in the same compartment. Thus, particles of the electric component that are shed (i.e., shedding particles) due to contact or oxidation may contaminate the photosensitive region of the photosensitive member, or adhere to the filter element, resulting in defective images.

Also, during the manufacturing process and assembly process afterwards, the photosensitive member is exposed to the air and may collect dust particles, which would compromise the quality of the device. In order to prevent collection of dust, the manufacturing process may need to be carried in a clean room, adding significant costs to the process.

Embodiments disclosed herein are directed to new devices, modules, and systems that reduce and/or eliminate the disadvantages associated with common image sensing devices. These devices, modules and systems can provide better protection of the semiconductor elements and/or the photosensitive member, and also reduce manufacturing difficulties. Methods of making and using the inventive devices are also disclosed herein.

In some embodiments, a process of manufacturing a semiconductor module is provided. In one embodiment, the semiconductor module comprises a circuit board that contains or can be prepared to contain electric components required by the semiconductor module. The circuit board, e.g., a printed circuit board (PCB), can have a first surface that would face ae lens assembly when assembled into an image-sensing device, referred to as a "lens-facing surface." The circuit board can also include an opposite surface, referred to as a "back surface."

A "photosensitive member" as used herein refers to a semiconductor material having a substantively smooth surface which is sensitive to light and can be configured to convert light to electric signals. The surface is commonly flat and the member typically comprises an electric circuit on a wafer, which is made of semiconducting materials with methods readily known in the art.

In some embodiments, the photosensitive member is not in direct contact with any of the electric components. In some embodiments, the photosensitive member is electrically coupled to the circuit board via the conducting wires and the electric intermediate. The electric intermediate may be used to make electrical connections between electric components/conducting wires, as described in detail later.

In some embodiments, a molding component can be used to encapsulate a photosensitive member and couple said member to the circuit board. Preferably, the molding component also encapsulates and protects the electric components on the circuit board. As described in further detail later, various materials and methods can be used to achieve encapsulation of the photosensitive member and/or the electric components. For instance, a transparent material can be used to form the molding component. In some embodiments, the photosensitive surface of the photosensitive member, which is encapsulated by the transparent molding component, is thus insulated from the external environment.

Such prepared circuit board can be referred to as a "semiconductor module" and can be used to prepare image-sensing devices.

The transparent molding components of certain embodiments of the present disclosure can be configured to encapsulate the photosensitive member, electric components and the PCB completely, eliminating further need to protect the photosensitive area of the photosensitive member, thus reducing manufacturing cost and improving yield efficiency.

Product reliability is greatly improved with the present technology. When the photosensitive member is encapsulated by a transparent molding component, a semiconductor module can be processed in a relatively poor environment, e.g., outside a clean room. Dirty or slightly damaged semiconductor modules can be directly wiped clean, or can be cleaned by plasma, polishing or other methods to remove contaminations/scratches on the surface of the transparent molding component without risk of damage to the encapsulated photosensitive member.

Difficulties in manufacturing molds are reduced with the present technology. In conventional molding processes, a recess in a molding component near the photosensitive area of the photosensitive member is formed during the molding process by molds to let in the incident light. In contrast, for certain embodiments of the molding components described herein, which have a predetermined amount of transparency, there is less need, or even no need, to form such recess via molding tools. Accordingly, difficulties in manufacturing the molds can be greatly reduced, thereby reducing both the manufacturing time and cost. In addition, difficulties in producing the molding materials of the molding component may also be decreased, which further increases efficiency and lowers the manufacturing costs.

The transparent molding component may also assist the lens' optical properties. The transparent molding materials may have a higher light refractive index compared with the air. The transparent molding component and the lens can be viewed as an optical device as a whole. By adjusting the material and/or thickness of the molding component, different optical properties may be obtained. The transparent molding component may provide more choices for the design of the lens, and may help improving the optical performance and minimize the size of image-sensing devices.

The transparent property of the molding component may also provide a convenient method for visually examining the internal structure of a semiconductor module without utilizing ultra-sonic wave or x-ray inspection. In addition, if there is any abnormality in subsequent manufacturing steps, direct inspections can be easily performed by removing any shading layer.

Another advantage associated with certain embodiments of the present disclosure is that a shading layer can be easily applied on the surface of the transparent molding components. As described herein, a shading layer refers to a layer of material that is substantially opaque/non-transparent and thus prevents the transmission of substantially all incident light. It is also much simpler to adjust the shading layer to achieve the desired size, position and shape of a "window" (e.g., an area through which light may pass) above the photosensitive area of the photosensitive member.

An optical filter can also be directly attached to the molding component above the photosensitive area, in some embodiments. Since the shading layer can also be easily adjusted, there is no longer a need for an extra mirror seat to help limit the size of the filter.

Alternatively, instead of using an optical filter, films or coatings that can function as optical filters, or light-absorbing materials can be applied on the non-shaded surface (i.e., a surface that does not comprises a shading layer thereon) of the molding component to form a filtering/reflective layer. In some embodiments, the light-absorbing materials can also be mixed into the molding material. While a conventional optical filter is often made of inorganic glass, the molding materials described herein can utilize organic materials which have better transmittance, to improve filtering efficiency.

Exemplary Embodiments

FIG. 1 is a graphical representation illustrating an example of a semiconductor module 100 of the present disclosure that can be used in an image-sensing device, consistent with exemplary embodiments of the present disclosure. The module may comprise a number of components, some of which may be optional. In some embodiments, the module may include many more components than those shown in FIG. 1. However, it is not necessary that all of these components be shown in order to disclose an illustrative embodiment.

As shown in FIG. 1, the module may include a printed circuit board (PCB) 101 (an example of a circuit board), a photosensitive member 102, one or more electric components 103, one or more conducting wires 104, and a molding component 105. The PCB 101 may have a first surface 106. The electric components 103 and the photosensitive member 102 are positioned on the first surface 106 of the PCB 101. The photosensitive member 102 is electrically coupled to the PCB 101 via the conducting wires 104. The molding component 105 is configured to encapsulate the photosensitive member 102, the electric components 103 and the conducting wires 104. The molding component 105 may further secure the aforementioned components (e.g., the photosensitive member 102, the electric components 103, and the conducting wires 104) to the PCB 101, and also separate them from the ambient environment. The molding component 105 may be in direct contact with the photosensitive member 102, the electric components 103 and the PCB 101.

In some embodiments, at least a portion of the molding component 105 is transparent to allow at least 50% of the incident light to pass through the molding component 105 to reach the photosensitive member. In some embodiments, at least a portion of the molding component 105 is transparent to allow at least 80%, at least 85%, at least 90%, at least 95%, or at least 98% of the incident light to pass through the molding component 105 to reach the photosensitive member. In some embodiments, at least a portion of the molding component 105 is transparent to allow about 100% of the incident light to pass through the molding component 105 to reach the photosensitive member.

In some embodiments, the molding component 105 may have an optional recess 107 on the opposite side from the photosensitive member to accommodate components or an assembly, for example, an optical filter.

In some embodiments, the molding component 105 and the first surface 106 of the PCB 101 may collectively cover all surface areas of the photosensitive member 102 and the electric components 103.

In some embodiments, the photosensitive member 102 has a first, substantially flat surface, a second, substantially flat surface opposite to the first surface, and one or more side surfaces between the first surface and the second surface, wherein the first surface of the photosensitive member 102 is in contact with the first surface 106 of the PCB 101. The molding component 105 covers the second surface and the one or more side surfaces of the photosensitive member 102.

Figure 2:
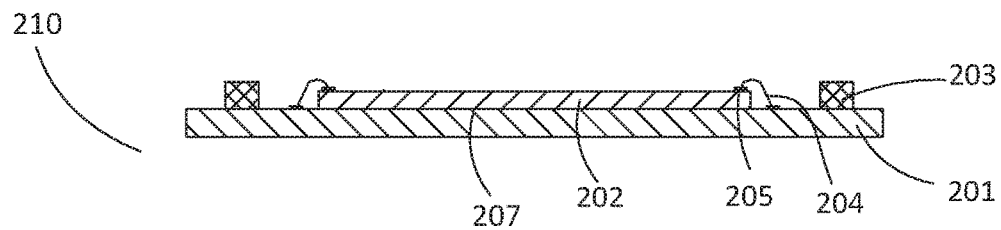
FIG. 2 is a graphical presentation illustrating a method for manufacturing semiconductor modules for image-sensing devices with a transparent molding component, consistent with exemplary embodiments of the present disclosure.
Figure 2:
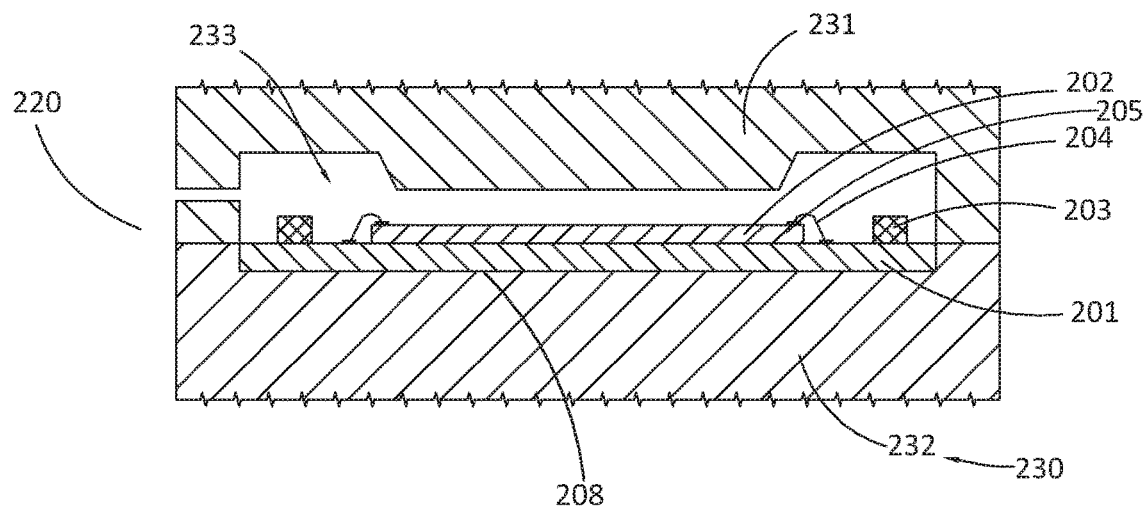
Figure 2:
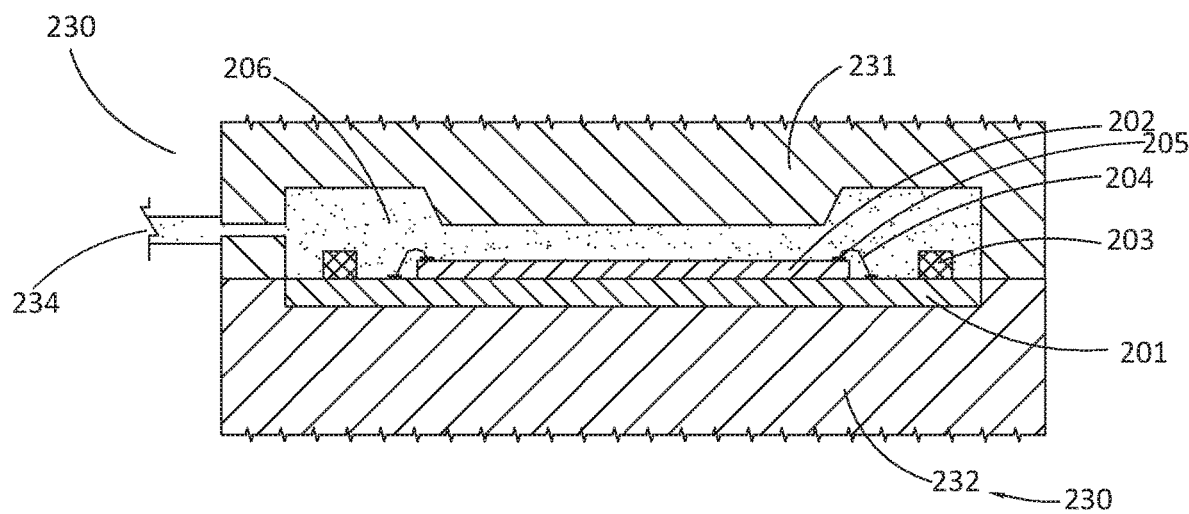

FIG. 2 is a graphical presentation illustrating a method 200 for manufacturing semiconductor modules for image-sensing devices with a transparent molding component, in accordance with one exemplary embodiment of the present disclosure.

At step 210 in FIG. 2, a pre-assembled PCB is prepared for molding. The pre-assembled PCB may include a PCB 201, a photosensitive member 202, one or more electric components 203, one or more conducting wires 204, and electric intermediate 205. The PCB 201 may have a first surface 207. The electric components 203 and the photosensitive member 202 are positioned on the first surface 207 of the PCB 201. The photosensitive member 202 is electrically coupled to the PCB 201 via the conducting wires 204 and the electric intermediate 205.

At step 220 in FIG. 2, a pair of molds 230 comprising an upper mold 231 and a lower mold 232 is applied to the pre-assembled PCB. The molds 230 may enclose the PCB 201, with the lower mold 232 closely contacting a second surface 208 of the PCB 201, and the upper mold 231 forming a space 233 above the first surface 207 of the PCB 201.

At step 230 in FIG. 2, a molding material may be injected into the space 233 through an opening 234 of the molds 230. A molding component 206 may thus be formed within the space 233. In some embodiments, the molding material may be polyvinyl methacrylate, polystyrene, polyester, polycarbonate, poly-4-methylpentene-1, polyacrylate, transparent epoxy resin, tris(1-aziridinyl)phosphine oxide (APO) resin, ZEONEX resin, ARTON resin, or any combination thereof.

In some embodiments, at least a portion of the molding component 206 is transparent to allow at least 50% of the incident light to pass through the molding component 206 to reach the photosensitive member 202. In some embodiments, at least a portion of the molding component 206 is transparent to allow at least 80%, at least 85%, at least 90%, at least 95%, or at least 98% of the incident light to pass through the molding component 206 to reach the photosensitive member 202. In some embodiments, at least a portion of the molding component 206 is transparent to allow about 100% of the incident light to pass through the molding component 206 to reach the photosensitive member 202.

In some embodiments, the molding component 206 may also be formed by a technique including, but not limited to, blow molding, powder metallurgy and sintering, compression molding, extrusion molding, laminating, reaction injection molding, matrix molding, rotational molding, spin casting, transfer molding, thermoforming, vacuum forming, a mix reaction, heating, exposure to UV light, combinations thereof, etc.

While not shown in FIG. 2, in some embodiments, the method 200 further comprises assembling the semiconductor module into a lens assembly. In some embodiments, the method 200 further comprises, prior to assembling the semiconductor module into a lens assembly: applying an optical filter/film/coating on at least a portion of a surface of the molding component 206, and applying a shading layer on at least a portion of a surface of the molding component 206. In some embodiments, the optical filter/film/coating and/or the shading layer is applied to the surface of the molding component 206 opposite the surface coupled to the PCB 201. In some embodiments, the optical filter/film/coating may be applied to a portion of the surface of the molding component 206 opposite the surface coupled to the PCB 201, and the shading layer may be applied to the remaining portions of said surface of the molding component 206.

In some embodiments, applying the optical filter/film/coating and the shading layer may be carried out in any order. In some embodiments, the method of applying the optical film/coating and the shading layer may include, but is not limited to, electroplating, plating, sputtering, attaching, printing, spraying, wrapping, molding, injection molding, etc.

While also not shown in FIG. 2, in some embodiments, a protection layer may be formed on at least a portion of the surface of the molding component 206 (e.g., the surface of the molding component 206 opposite the surface coupled to the PCB 201) prior to applying the optical filter/film/coating and the shading layer. The protection layer may be formed on the surface where optical filter/film/coating or shading layer would not be applied. The protection layer may be a removable layer, and thus removed when needed, for example, after the optical filter/film/coating has been applied. The protection layer may comprise a mask, mold, other media, or shading material/layer.

FIGS. 3(a)-(h) present different embodiments of a semiconductor module 300 with a transparent molding component, in accordance with one exemplary embodiment of the present disclosure.

Figure 3:
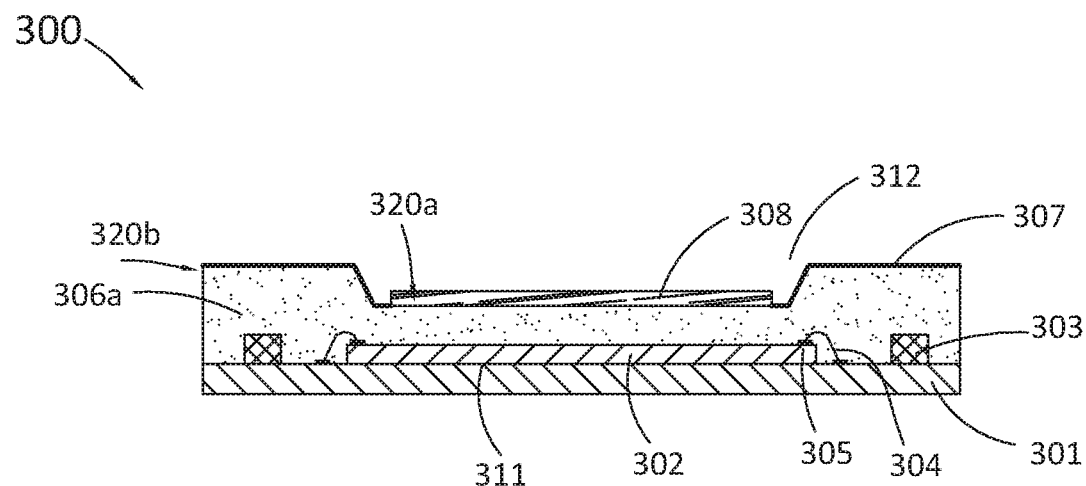
FIGS. 3(a)-(h) present different embodiments of a semiconductor module with a transparent molding component, consistent with exemplary embodiments of the present disclosure.
Figure 3:
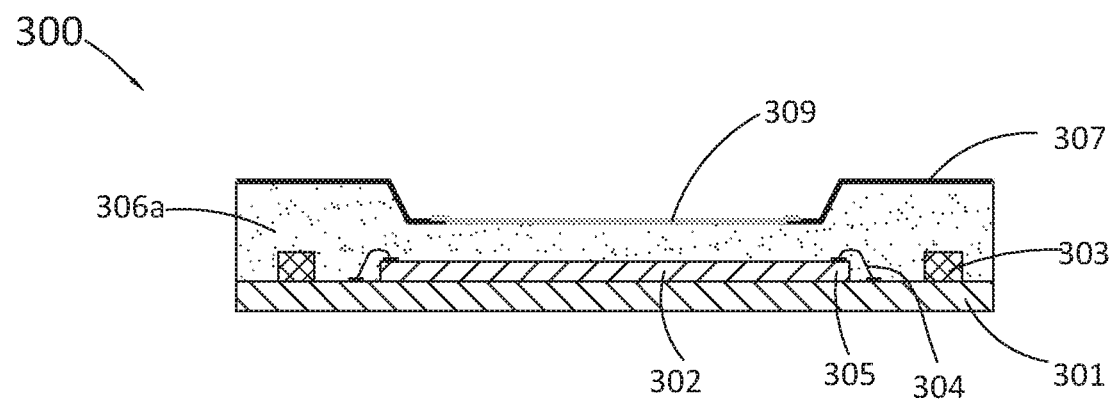
Figure 3:
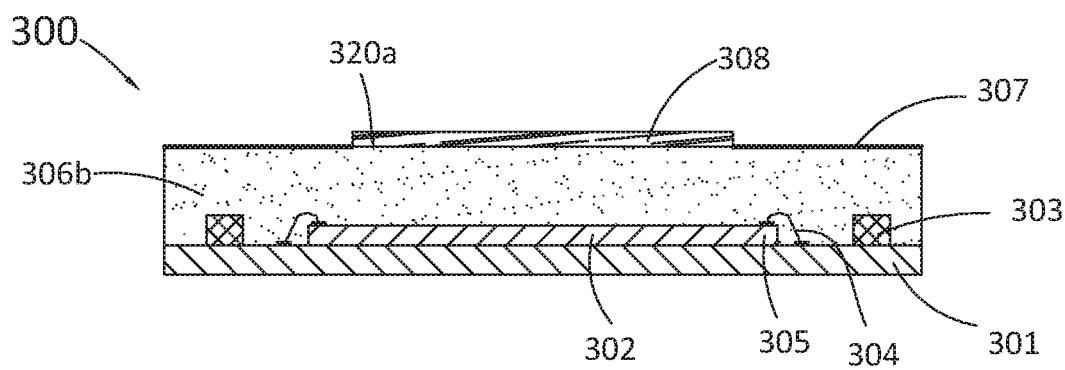
Figure 3:
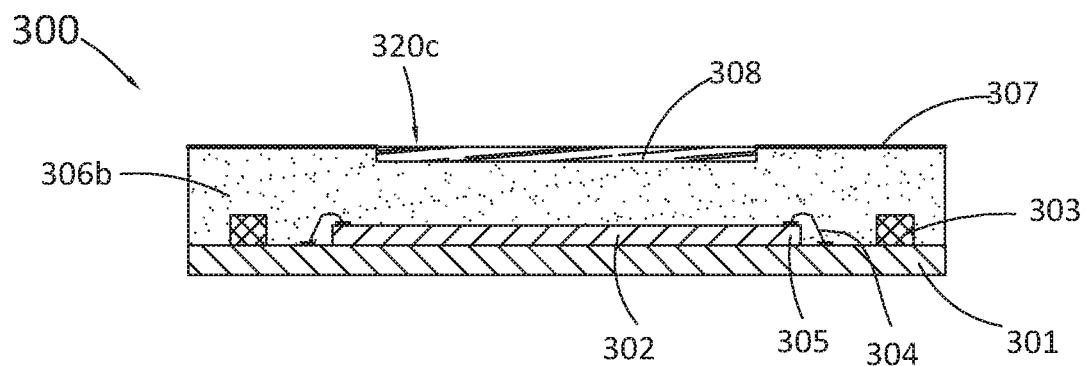
Figure 3:
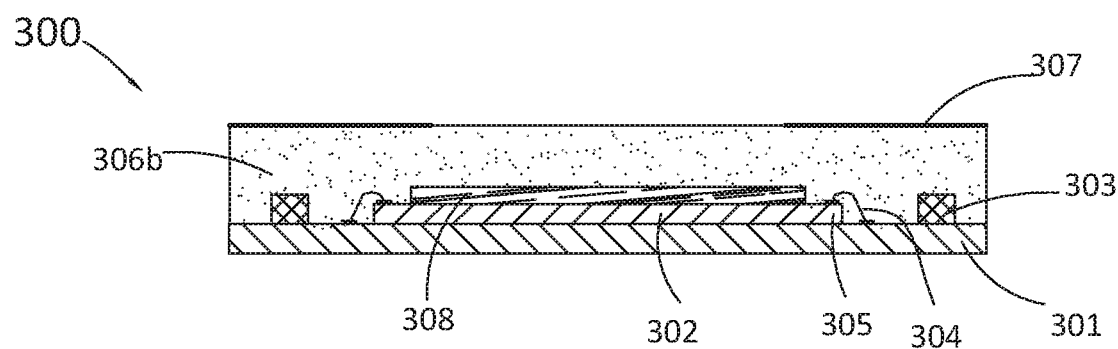
Figure 3:
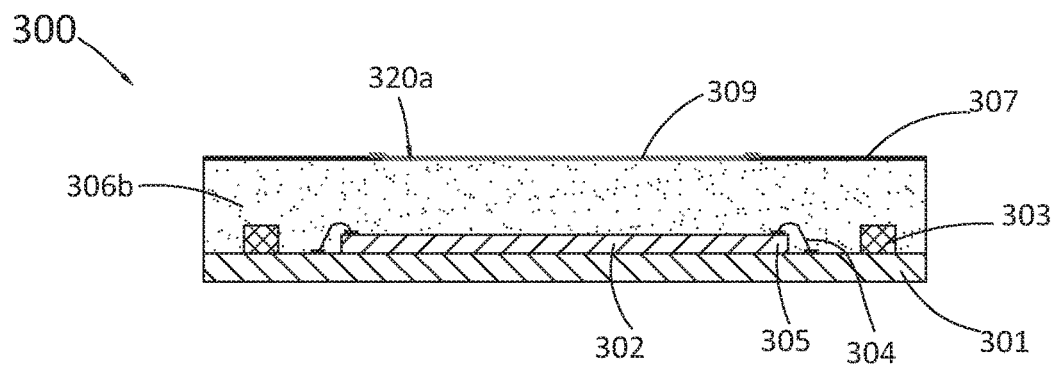
Figure 3:
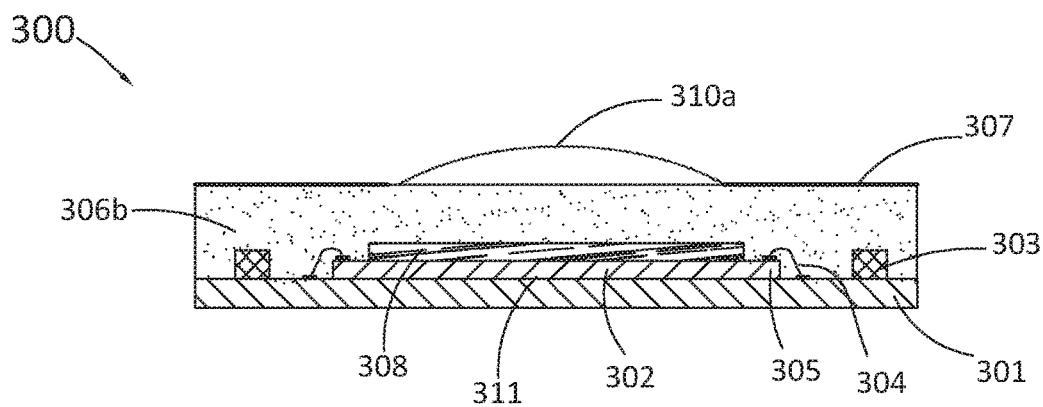
Figure 3:
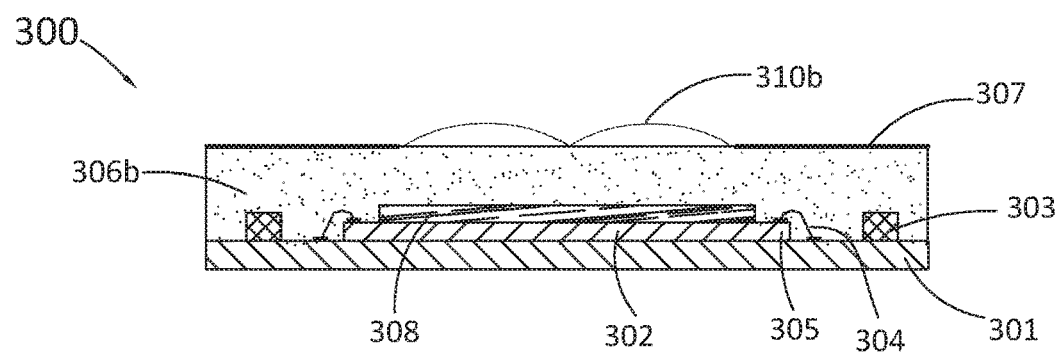

In FIG. 3(a), the module 300 may include a PCB 301, a photosensitive member 302, one or more electric components 303, one or more conducting wires 304, welding materials 305, a molding component 306a, a shading layer 307 and an optical filter 308. The PCB 301 may have a first surface 311. The electric components 303 and the photosensitive member 302 are positioned on the first surface 311 of the PCB 301. The photosensitive member 302 is electrically coupled to the PCB 301 via the conducting wires 304 and the electric intermediate 305. The molding component 306a is configured to encapsulate the photosensitive member 302, the electric components 303, the conducting wires 304 and the electric intermediate 305. The molding component 306a may further secure the aforementioned components (e.g., the photosensitive member 302, the electric components 303, the conducting wires 304, and the electric intermediate 305) to the PCB 301, and separate them from the ambient environment.

The molding component 306a may be in direct contact with the photosensitive member 302, the electric components 303 and the PCB 301. In some embodiments, at least a portion of the molding component 306a is transparent to allow at least 50% of the incident light to pass through the molding component 306a to reach the photosensitive member 302. In some embodiments, at least a portion of the molding component 306a is transparent to allow at least 80%, at least 85%, at least 90%, at least 95%, or at least 98% of the incident light to pass through the molding component 306a to reach the photosensitive member 302. In some embodiments, at least a portion of the molding component 306a is transparent to allow about 100% of the incident light to pass through the molding component 306a to reach the photosensitive member 302.

In some embodiments, the molding component 306a may have a recess 312 on the opposite side from the photosensitive member 302. The optical filter 308 may be placed in the recess 312 on one or more portions of the exterior surface 320a of the molding component 306a (as shown in FIG. 3(a)), allowing light to traverse in the order of the optical filter 308 and the molding component 306a to reach the photosensitive member 302.

The shading layer 307 may be applied on one or more portions of the surface 320b of the transparent molding component 306a (as shown in FIG. 3(a)). In particular, the shading layer 307 may be applied on the portions of the surface 320b of the molding component 306a that are not covered by the optical filter 308. The shading layer 307 may be non-transparent. The configuration/position and non-transparency of the shading layer 307 may therefor form a desired "window" above the photosensitive area of the photosensitive member 302 through which light may enter to reach the photosensitive member 302. By adjusting the size, position or shape of the shading layer 307, the amount of light entering into the molding component 306a can be adjusted. In some embodiments, a method of applying the shading layer may include, but is not limited to, electroplating, plating, sputtering, attaching, printing, spraying, wrapping, molding, injection molding, etc.

In some embodiments, instead of using an optical filter, an optical film/coating 309 that can function as an optical filter can be applied on the non-shaded surface of the molding component 306a (e.g., on the portions of the surface of the molding component 306a that are not covered by the shading layer 307) to form a filtering/reflective layer 309, as shown in FIG. 3(b). In some embodiments, a method of applying the optical film/coating may include, but is not limited to, electroplating, plating, sputtering, attaching, printing, spraying, wrapping, molding, injection molding, etc.

FIGS. 3(c)-(f) show embodiments in which the semiconductor module comprises a molding component 306b having a substantially flat surface, e.g., the molding component may have a very shallow recess, a negligible recess, or no recess. In some embodiments, an optical filter may be placed inside the recess. In some embodiments, the optical filter 308 may be located on the exterior surface 320a of the molding component 306b, as shown in FIG. 3(c). In some embodiments, the optical filter 308 may be encapsulated inside the molding component 306b, with the upper surface of the optical filter 308 contacting the interior surface 320c of the molding component 306b, as shown in FIG. 3(d). In some embodiments, the optical filter 308 may be encapsulated inside the molding component 306b, and directly contacting the photosensitive member 302, allowing light to traverse in the order of the molding component 306b and the optical filter 308 to reach the photosensitive member 302, as shown in FIG. 3(e). In some embodiments, the optical film/coating 309 may be located on the exterior surface 320a of the molding component 306b, as shown in FIG. 3(f).

In some embodiments, as shown in FIG. 3(g), the semiconductor module 300 may include a PCB 301, a photosensitive member 302, one or more electric components 303, one or more conducting wires 304, electric intermediate 305, a molding component 306b, a shading layer 307, an optical filter 308 and a coating 310a. The PCB 301 may have a first surface 311. The electric components 303 and the photosensitive member 302 are positioned on the first surface 311 of the PCB 301. The photosensitive member 302 is electrically coupled to the PCB 301 via the conducting wires 304 and the electric intermediate 305. The optical filter 308 may be directly located on the photosensitive member 302 and encapsulated between the photosensitive member 302 and the molding component 306b, allowing light to traverse in the order of the molding component 306b and the optical filter 308 to reach the photosensitive member 302. The molding component 306b can have a substantially flat surface, e.g., the molding component may have a very shallow recess, a negligible recess, or no recess. In some embodiments, an optical filter may be placed inside the recess. The molding component 306b is configured to encapsulate the photosensitive member 302, the electric components 303, the optical filter 308, the conducting wires 304 and the electric intermediate 305. The molding component 306b may further secure the aforementioned components (e.g., the photosensitive member 302, the electric components 303, the conducting wires 304, and the electric intermediate 305) to the PCB 301, and separate them from the ambient environment. The coating 310a may be applied on the non-shaded surface of the molding component 360b (e.g., on the portions of the surface of the molding component 306a that are not covered by the shading layer 307).

In some embodiments, the coating 310a may have optical properties, and can function as an optical filter, a reflective layer, etc. In some embodiments, the coating 310a may be used to protect the molding component 306b. In some embodiment, the coating 310a may be formed in different shapes. For instance, in one embodiment, the coating 310a may have a curved shape or other such suitable shape as would be appreciated by skilled artisans upon reading the present disclosure. The curvature or shape of the coating 310a may introduce additional optical properties, for instance, working as an optical lens. In some embodiments, the coating 310a may not be a single structure, but rather comprise more than one coating piece/part. In one embodiment, the coating 310a may include a plurality of coating pieces, each of which may independently have the same or a different shape as another of the coating pieces. For example, the coating 310b in FIG. 3(h) includes two coating pieces, each having a curved shape.

Figure 4:
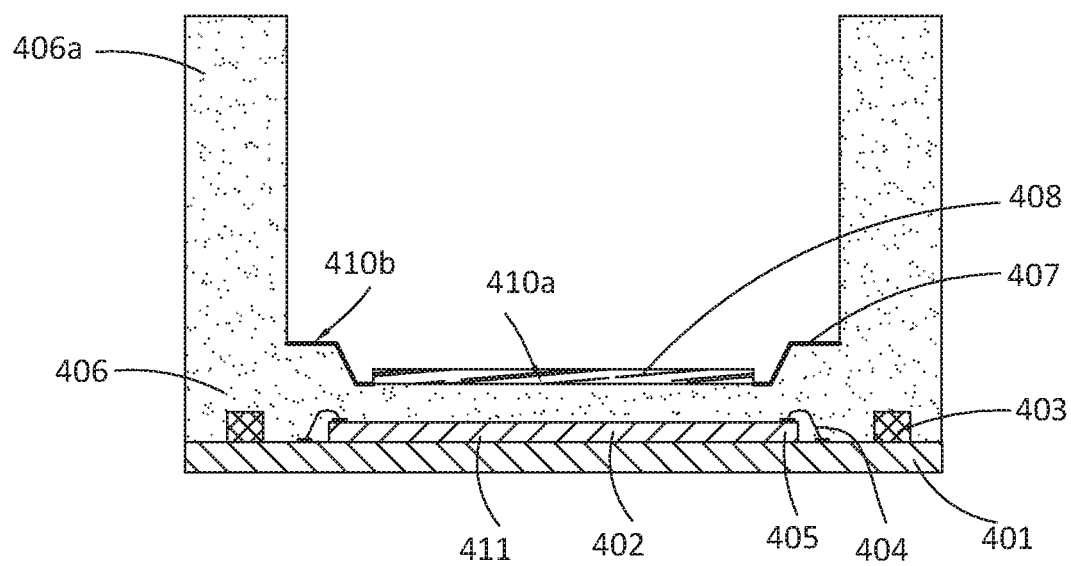
FIG. 4 presents another exemplary embodiment of a semiconductor module with a transparent molding component, consistent with exemplary embodiments of the present disclosure.

FIG. 4 presents another exemplary embodiment of a semiconductor module 400 with a transparent molding component, in accordance with one exemplary embodiment of the present disclosure.

In FIG. 4, the module 400 may include a PCB 401, a photosensitive member 402, one or more electric components 403, one or more conducting wires 404, electric intermediate 405, a molding component 406, a shading layer 407 and an optical filter 408. The PCB 401 may have a first surface 411. The electric components 403 and the photosensitive member 402 are positioned on the first surface 411 of the PCB 401. The photosensitive member 402 is electrically coupled to the PCB 401 via the conducting wires 304 and the electric intermediate 405. The molding component 406 is configured to encapsulate the photosensitive member 402, the electric components 403, the conducting wires 404 and the electric intermediate 405, and separate them from the ambient environment.

As shown in FIG. 4, the molding component 406 may be in direct contact with the photosensitive member 402, the electric components 403 and the PCB 401. In some embodiments, the molding component 406 may further comprise extensions 406a to provide housing for one or more optical lenses. In some embodiments, the extensions 406a may be integratedly molded with the molding component 406. In some embodiments, the extensions 406a may be separate parts/structures of the molding component 406.

In some embodiments, the molding component 406 may have a recess 410a on the opposite side from the photosensitive member 402. The optical filter 408 may be placed in the recess 410a of the molding component 406. In some embodiments, the molding component 406 may have a step-like structure 410b, where the step-like structure 410b may be configured to support any component or assembly. The shading layer 407 may be applied on the step-like structure 410b.

In some embodiments, at least a portion of the molding component 406 is transparent to allow at least 50% of the incident light to pass through the molding component 406 to reach the photosensitive member 402. In some embodiments, at least a portion of the molding component 406 is transparent to allow at least 80%, at least 85%, at least 90%, at least 95%, or at least 98% of the incident light to pass through the molding component 406 to reach the photosensitive member 402. In some embodiments, at least a portion of the molding component 406 is transparent to allow about 100% of the incident light to pass through the molding component 406 to reach the photosensitive member 402.

In some embodiments, the shading layer 307 may be non-transparent. The configuration/position and non-transparency of the shading layer 407 may therefor form a desired "window" above the photosensitive area of the photosensitive member 402 through which light may enter to reach the photosensitive member 402. By adjusting the size, position or shape of the shading layer 407, the amount of light entering into the molding component 406 can be adjusted. In some embodiments, a method of applying the shading layer 407 may include, but is not limited to, electroplating, plating, sputtering, attaching, printing, spraying, wrapping, molding, injection molding, etc.

Figure 5A:
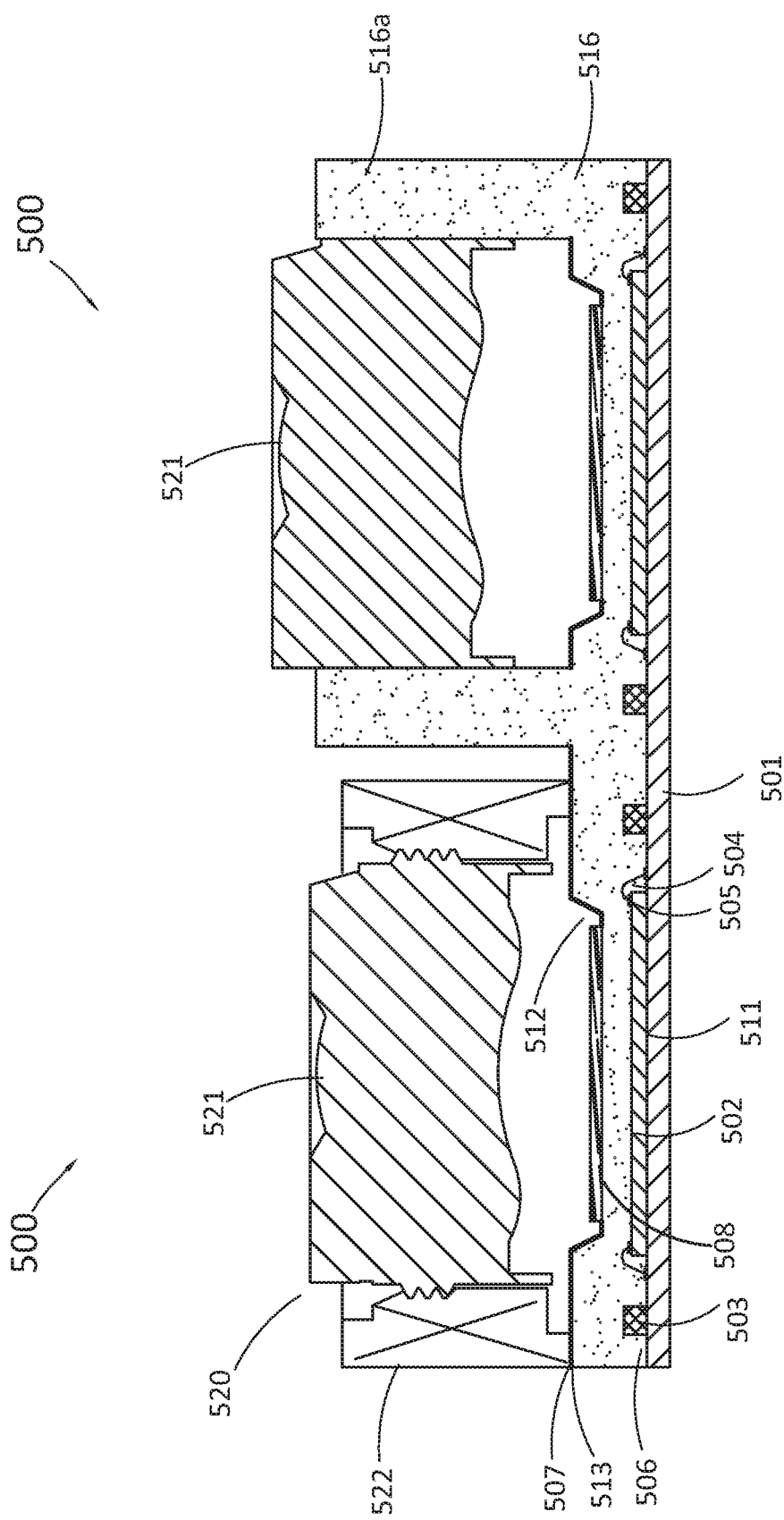
FIGS. 5(a)-(b) present different exemplary embodiments of an image-sensing device with a transparent molding component, consistent with exemplary embodiments of the present disclosure.
Figure 5:
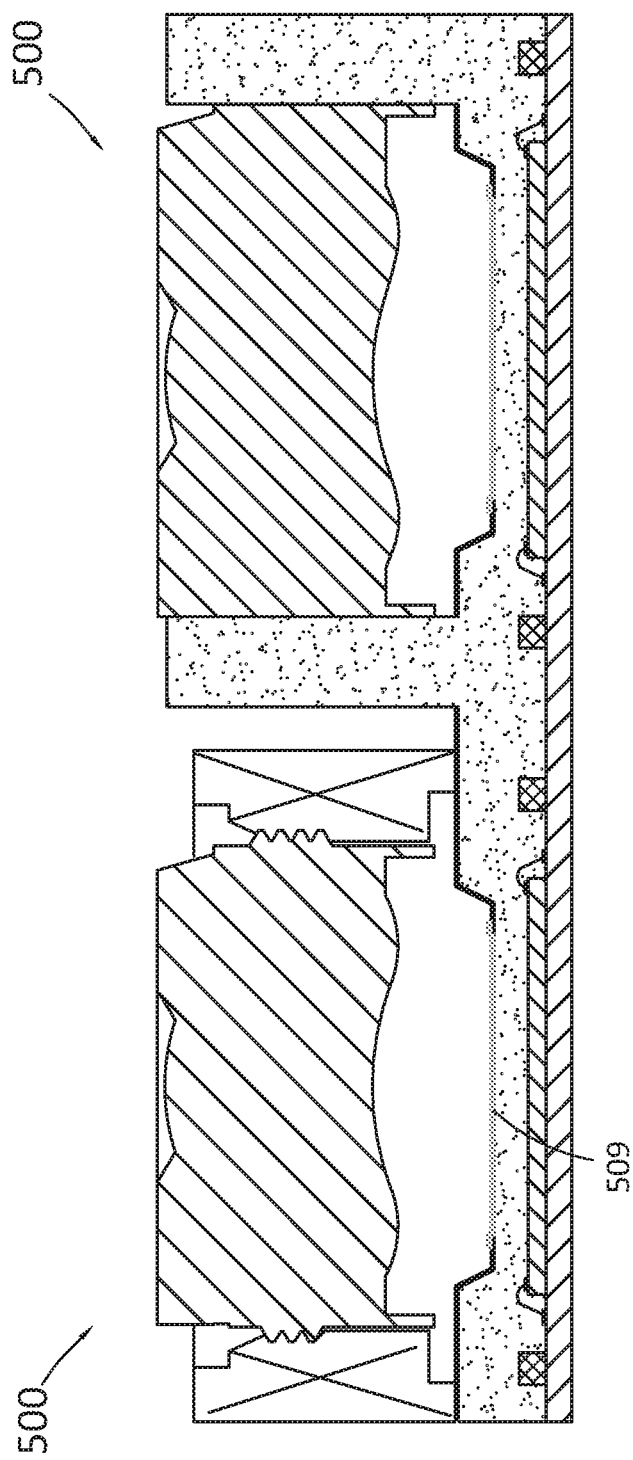

FIGS. 5(a)-(b) present different exemplary embodiments of an image-sensing device 500 with a transparent molding component, in accordance with one exemplary embodiment of the present disclosure.

As shown in FIG. 5(a), the device 500 (the unit in the left panel) may include a lens assembly 520, a photosensitive member 502, one or more electric components 503, one or more conducting wires 504, electric intermediate 505, a molding component 506, a shading layer 507 and an optical filter 508. The PCB 501 may have a first surface 511. The electric components 503 and the photosensitive member 502 are positioned on the first surface 511 of the PCB 501. The photosensitive member 502 is electrically coupled to the PCB 501 via the conducting wires 504 and the electric intermediate 505. The molding component 506 is configured to encapsulate the photosensitive member 502, the electric components 503, the conducting wires 504 and the electric intermediate 505. The molding component 506 may further secure the aforementioned components (e.g., the photosensitive member 502, the electric components 503, the conducting wires 504 and the electric intermediate 505) to the PCB 501, and separate them from the ambient environment.

The lens assembly 520 may include one or more lenses 521 and a holder 522 for supporting the lenses 521. The holder 522 may sit on the molding component 506, and the molding component 506 may provide support to the lens assembly 520. In some embodiments, the holder 522 may also work as an actuator to move the lens for focusing or zooming.

The molding component 506 may be in direct contact with the photosensitive member 302, the electric components 503 and the PCB 501. In some embodiments, at least a portion of the molding component 506 is transparent to allow at least 50% of the incident light to pass through the molding component 506 to reach the photosensitive member 502. In some embodiments, at least a portion of the molding component 506 is transparent to allow at least 80%, at least 85%, at least 90%, at least 95%, or at least 98% of the incident light to pass through the molding component 306a to reach the photosensitive member 502. In some embodiments, at least a portion of the molding component 506 is transparent to allow about 100% of the incident light to pass through the molding component 506 to reach the photosensitive member 502.

In some embodiments, the molding component 506 may have a recess 512 on the opposite side from the photosensitive member 502. The optical filter 508 may be placed in the recess of the molding component 506.

The shading layer 507 may be applied on the surface 513 of the transparent molding component 506. The shading layer 507 may be non-transparent. The configuration/position and non-transparency of the shading layer 407 may therefor form a desired "window" above the photosensitive area of the photosensitive member 502 through which light may enter to reach the photosensitive member. By adjusting the size, position or shape of the shading layer 507, the amount of light entering into the molding component 506 can be adjusted.

In some embodiments, the material of the molding component 506 may comprise polyvinyl methacrylate, polystyrene, polyester, polycarbonate, poly-4-methylpentene-1, polyacrylate, transparent epoxy resin, tris(1-aziridinyl)phosphine oxide (APO) resin, ZEONEX resin, ARTON resin, and combinations thereof.

In some embodiments, the molding component 506 may also be formed by a technique including, but not limited to, blow molding, powder metallurgy and sintering, compression molding, extrusion molding, laminating, reaction injection molding, matrix molding, rotational molding, spin casting, transfer molding, thermoforming, vacuum forming, a mix reaction, heating, exposure to UV light, combinations thereof, etc.

In some embodiments, a method of applying the shading layer 507 may include, but is not limited to, electroplating, plating, sputtering, attaching, printing, spraying, wrapping, molding, injection molding, etc.

In some embodiments, a portion 516 of the molding component 506 may further comprise extensions 516a to provide housing for one or more optical lenses, as shown in the right panel of FIG. 5(a). In some embodiments, the extensions 516a may be integratedly molded with the portion 516 of the molding component. In some embodiments, the extensions 516a may be separate parts/structures of the molding component 506. The portion 516 of the molding component 506, and particularly the extensions 516a thereof, can directly support one or more lenses 521, such that the lens assembly may only include one or more lenses 521 without support structures, e.g. a holder such as 522 of FIG. 5(a).

In some embodiments, the image-sensing device 500 with a transparent molding component may comprise an optical film/coating. For instance, instead of using an optical filter 508, an optical film/coating 509 that can function as an optical filter can be applied on the non-shaded surface of the molding component to form a filtering/reflective layer, as shown in the units of FIG. 5(b). In some embodiments, a method of applying the optical film/coating may include, but is not limited to, electroplating, plating, sputtering, attaching, printing, spraying, wrapping, molding, injection molding.

In some embodiments, a coating (such as shown in FIGS. 3(g)-(h)) may be applied on the exterior surface of the molding component of an image-sensing device (such as shown in FIGS. 5(a)-(b)). The coating may have optical properties, and can function as an optical filter, a reflective layer, etc. In some embodiments, the coating may only be used to protect the molding component. The coating may include a plurality of coating pieces, and may be formed in different shapes.

Figure 6:
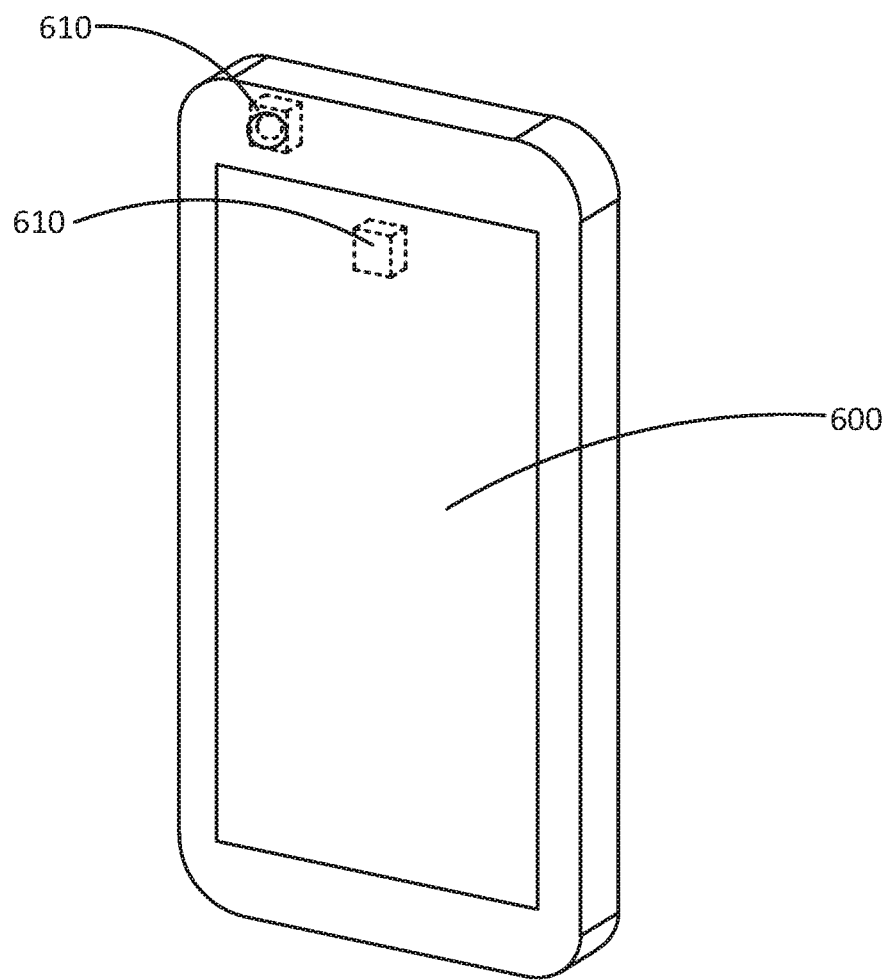
FIG. 6 is a graphical representation illustrating an exemplary application of an image-sensing device, consistent with exemplary embodiments of the present disclosure.

In some embodiments, an image-sensing device, such as shown in FIGS. 5(a)-(b), may be implemented in a mobile or stationary device which can take photos or videos. FIG. 6 shows an exemplary embodiment of an imaging-sensing device 610 implemented in a mobile phone 600. Since the molding component in the image-sensing device 610 is transparent, the device 610 may be installed in any location in the mobile phone 600. In some embodiments, the image-sensing device may also be implemented in other electronic devices, including but not limited to, a tablet computer, an electronic book, an MP3/4/5, a personal digital assistant, a camera, a television set, a washing machine, a car, a train, a plane, etc.

In some embodiments, the device further comprises the image-sensing device is enclosed in an electric device that comprises at least a processor and a storage.

Unless otherwise defined, all technical and scientific terms used herein have the same meaning as commonly understood by one of ordinary skill in the art to which this invention belongs.

The inventions illustratively described herein may suitably be practiced in the absence of any element or elements, limitation or limitations, not specifically disclosed herein. Thus, for example, the terms "comprising", "including," "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions embodied therein herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

In addition, where features or aspects of the invention are described in terms of Markush groups, those skilled in the art will recognize that the invention is also thereby described in terms of any individual member or subgroup of members of the Markush group.

All publications, patent applications, patents, and other references mentioned herein are expressly incorporated by reference in their entirety, to the same extent as if each were incorporated by reference individually. In case of conflict, the present specification, including definitions, will control.

It is to be understood that while the disclosure has been described in conjunction with the above embodiments, that the foregoing description and examples are intended to illustrate and not limit the scope of the disclosure. Other aspects, advantages and modifications within the scope of the disclosure will be apparent to those skilled in the art to which the disclosure pertains.

What is claimed is:

1. A semiconductor module, comprising:
a printed circuit board (PCB) having a first surface;
a photosensitive member positioned on the first surface of the PCB;
at least an electric component disposed on the first surface of the PCB; and
a molding component which, along with the first surface of the PCB, completely encloses and separates the photosensitive member and all the electric component from the ambient environment,
wherein the molding component is in direct contact with the photosensitive member, the electric component and the first surface of the PCB,
wherein the photosensitive member is integrated with the molding component, and the molding component and the first surface of the PCB collectively cover and are in direct contact with all surface areas of the photosensitive member and the electric component, and wherein the molding component comprises a recess on an opposite side from the photosensitive member to accommodate an optical filter, the molding component separates the photosensitive member and the optical filter, and at least a portion of the molding component is transparent to allow at last 50% of the incident light to pass through the molding component to reach the photosensitive member.

2. The semiconductor module of claim 1, wherein the photosensitive member has a first, substantially flat surface in contact with the first surface of the PCB, a second, substantially flat surface opposite to the first surface, and one or more side surfaces between the first surface and the second surface, wherein the molding component covers the second surface and the one or more side surfaces.

3. The semiconductor module of claim 1, further comprising a second optical filter disposed on the photosensitive member and encapsulated between the photosensitive member and the molding component, allowing light to traverse in the order of the molding component and the second optical filter to reach the photosensitive member.

4. The semiconductor module of claim 1, further comprising the optical filter disposed on the molding component allowing light to traverse in the order of the optical filter and the molding component to reach the photosensitive member.

5. The semiconductor module of claim 4, wherein the optical filter comprises an optical film, an optical coating, a light-absorbing material applied on the molding component, or a light-absorbing material mixed into the molding component.

6. The semiconductor module of claim 1, wherein the molding component comprises extensions to provide housing for one or more optical lenses.

7. The semiconductor module of claim 1, further comprising at least a wire embedded in the molding component, wherein the wire connects the photosensitive member and the PCB.

8. The semiconductor module of claim 1, wherein the molding component comprises polyvinyl methacrylate, polystyrene, polyester, polycarbonate, poly-4-methylpentene-1, polyacrylate, transparent epoxy resin, tris(1-aziridinyl)phosphine oxide (APO) resin, ZEONEX resin, ARTON resin, or any combination thereof.

9. The semiconductor module of claim 1, further comprising a shading layer which is non-transparent and covering a portion of the exterior surface of the molding component while allowing light coming into and through the molding component to reach the photosensitive member.

10. The semiconductor module of claim 9, wherein the non-transparent cover is adjustable to adjust the amount of light entering into the molding component.

11. An image-sensing device, comprising one or more lens disposed in a lens assembly connected to the semiconductor module of claim 1.

12. A method of preparing the semiconductor module of claim 1, comprising:
enclosing the PCB comprising the photosensitive member and the electric component positioned on the first surface of the PCB in a mold having an opening; and
injecting a molding material through the opening into the mold and allowing the molding material to form the molding component encapsulating the sensitive member and the electric component on the PCB.

* * * * *